United States Patent [19]

Terada et al.

[11] Patent Number: 4,858,194

[45] Date of Patent: Aug. 15, 1989

[54] NONVOLATILE SEMICONDUCTOR MEMORY DEVICE USING SOURCE OF A SINGLE SUPPLY VOLTAGE

[75] Inventors: Yasushi Terada; Takeshi Nakayama; Kazuo Kobayashi, all of Hyogo, Japan

[73] Assignee: Mitsubishi Denki Kabushiki Kaisha, Tokyo, Japan

[21] Appl. No.: 154,573

[22] Filed: Feb. 10, 1988

[30] Foreign Application Priority Data

Jul. 21, 1987 [JP] Japan ................................ 62-182698

[51] Int. Cl.$^4$ .............................................. G11C 13/00
[52] U.S. Cl. ................................ 365/203; 365/189.01; 365/222
[58] Field of Search ......................... 365/203, 189, 230

[56] References Cited

U.S. PATENT DOCUMENTS 4,706,220 11/1987 Spence ................................. 365/203
4,740,921 4/1988 Lewandowski et al. ............ 365/203

OTHER PUBLICATIONS

IEEE Transactions on Electron Devices: "Electrically Erasable and Reprogrammable Read-Only Memory Using the n-Channel SIMOS One-Transistor Cell", vol. ED-24, No. 5, May 1977, pp. 606-610.
IEEE Electron Device Letters: "A Single Transistor Electrically Alterable Cell" by P. Cacharelis et al., vol. EDL-6, No. 10, Oct. 1985, pp. 519-521.
IEEE Electron Device Letters: "A Source-Side Injection Erasable Programmable Read-Only-Memory Device", by A. T. Wu et al., vol. EDL-7, No. 9, Sep. 1986, pp. 540-542.
IEEE Electron Device Letters: "A True Single-Transistor Oxide-Nitride-Oxide EEPROM Device" by T. Y. Chan, vol., EDL-8, No. 3, Mar. 1987, pp. 93-95.
ISCC, IEEE: "A 128K Flash EEPROM Using Double Polysilicon Technology", by G. Samachisa et al., Feb. 25, 1987, pp. 76-77.
IEEE Journal: "A 1.5 V Single-Supply One-Transistor CMOS EEPROM" by B. Gerber et al., vol. SC-16, No. 3, Jun. 1983, pp. 195-199.
IEEE Journal: "An 8192-Bit Electrically Alterable ROM Employing a One-Transistor Cell With Floating Gate" by R. G. Muller et al., vol. SC-12, No. 5, Oct. 1977, pp. 507-514.

Primary Examiner—Terrell W. Fears
Attorney, Agent, or Firm—Lowe, Price, LeBlanc, Becker & Shur

[57] ABSTRACT

A nonvolatile semiconductor memory device comprises memory cells each formed of a single memory transistor and can be accessed in a bit-by-bit manner to eliminate an erase cycle in a data write cycle. The memory device comprises precharging circuits for precharging word lines and bit lines in the data write cycle, tri-level $V_{pp}$ switches, in response to a data to be written and an output of X decoder, for applying to a selected word line a write voltage $V_{pp}$ when the data to be written is "1" while a ground potential when the data to be written is "0", and further applying remaining non-selected word lines the precharge voltage, and tri-level $V_{pp}$ switches, in response to a data to be written and an output of Y decoder, for applying to a selected bit line the ground potential when the data to be written is "1" while the write high-voltage $V_{pp}$ when the data to be written is "0", and further to the remaining non-selected bit lines the precharge voltage.

12 Claims, 7 Drawing Sheets

NONVOLATILE SEMICONDUCTOR MEMORY DEVICE USING SOURCE OF A SINGLE SUPPLY VOLTAGE

BACKGROUND OF THE INVENTION

1. Field of the Invention

The present invention relates to a read-only memory capable of electrically writing and erasing information and more particularly, to an improvement of a so-called EEPROM (Electrically Erasable and Programmable Read-Only Memory), enabling EEPROM to be powered by a single supply voltage and to have an improved endurance.

2. Description of the Prior Art

Figure 1:
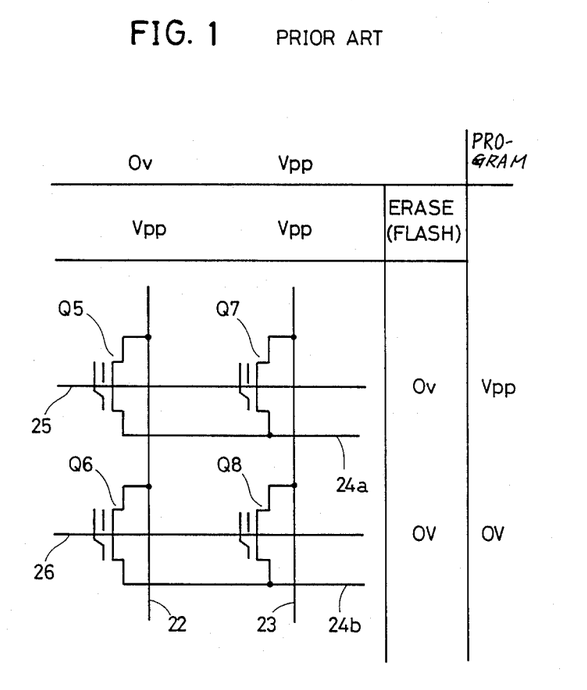
FIG. 1 is a diagram showing a structure of a memory portion of a conventional nonvolatile semiconductor memory device and the relation between voltages applied to each word line and each bit line at the time of erasing and at the time of programming in a data write cycle.

FIG. 1 is a diagram showing a schematic structure of a memory portion of a conventional nonvolatile semiconductor memory device and the relation between voltages applied to an electrode of each memory device at the time of data write cycle, which is, for example, disclosed in "A 128K Flash EEPROM Using Double Polysilicon Technology" by G. Samachisa, 1987 IEEE ISSS Digest of Technical Papers, pp. 76-77.

In FIG. 1, four memory transistors Q5 to Q8 are illustrated. Each of the memory transistors Q5 to Q8 comprises a floating gate for storing charges and a control gate for controlling, for example, injection/emission of charges to from the floating gate, and stores information in a nonvolatile manner. Each of the memory transistors Q5 to Q8 has a control gate formed to extend to a source region. Each of the memory transistors Q5 and Q7 has a control gate connected to a word line 25, and each of the memory transistors Q6 and Q8 has a control gate connected to a word line 26. Each of the memory transistors Q5 and Q6 has a drain connected to a bit line 22, and each of the memory transistors Q7 and Q8 has a drain connected to a bit line 23. Each of the memory transistors Q5 and Q7 has a source connected to a source line 24a, and each of the memory transistors Q6 and Q8 has a source connected to a source line 24b.

Figure 2:
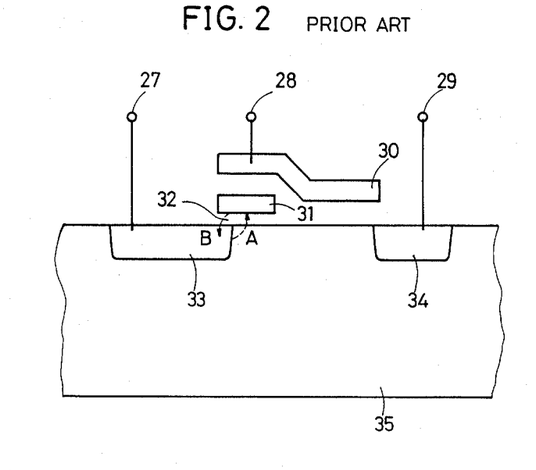
FIG. 2 is a cross-sectional view showing a schematic structure of a transistor constituting a memory cell used in the conventional nonvolatile semiconductor memory device.

FIG. 2 is a cross-sectional view showing a schematic structure of the memory transistor shown in FIG. 1. In FIG. 2, the memory transistor comprises a drain region 33 and a source region 34 formed in a predetermined region on the surface of a semiconductor substrate 35 by implanting and diffusing impurities, a floating gate 31 formed on an insulating film 32 for a part of the floating gate to overlap with the drain region 33, and a control gate 30 formed on the floating gate 31 to extend from the drain region 33 to the source region 34. The floating gate 31 is made to be electrically floating. The insulating film 32 is formed of a thin oxide film having a thickness of about 200 Å. In FIG. 2, a drain electrode 27, a control gate electrode 28 and a source electrode 29 are connected to a bit line, a word line and a source line, respectively. Referring now to FIGS. 1 and 2, description is made on operation for writing data in a conventional memory.

Data writing in the nonvolatile semiconductor memory device having the structure shown in FIG. 1 comprises an erase cycle and a program cycle. More specifically, information "1" is written to all the memory devices in the erase cycle and then, information "0" is written to the memory device to be programmed in the program cycle. Description is now made on operation at the time of the erase cycle. In the erase cycle, a program high-voltage $V_{pp}$ (about 20 to 25 V) is applied to all the bit lines 22 and 23 and at the same time, a ground potential 0 V is applied to all the word lines 25 and 26. Therefore, a high electric field is produced between the floating gate 31 and the drain 33 as shown in FIG. 2. The high electric field causes electrons stored in the floating gate 31 to be emitted to the drain 33 through the thin oxide film 32 by a tunnel phenomenon, as is shown by dotted arrow B in FIG. 2. In this state, the floating gate 31 is to be in a depletion state of electrons, so that the threshold voltage of the memory transistor with reference to the control gate 30 becomes lower than that before erase operation. This state is referred to as an erased state, in which a memory device stores logic "1". More specifically, after completion of the erase cycle, all the memory devices store information "1".

Description is now made of an operation at the time of the program cycle. A method of programming is the same as that in an EPROM capable of erasure by ultraviolet rays. That is, the selected bit line 23 is forced to the program high-voltage $V_{pp}$, the non-selected bit line 22 is forced to the ground potential 0 V, the selected word line is forced to the program high-voltage $V_{pp}$, and the non-selected word line 26 and the source lines 24a and 24b are forced to the ground potential 0 V. More specifically, in this state, programming to the memory transistor Q7 is performed, so that the high-voltage $V_{pp}$ is applied to the word line 25 and the bit line 23 connected to the selected memory transistor Q7. In this state, hot electrons are produced in the vicinity of the drain 33 of the transistor Q7. The produced hot electrons are accelerated by the high-voltage $V_{pp}$ applied to the control gate 30 to be injected into the floating gate 21, as is shown by the dotted line A in FIG. 2. As a result, the floating gate 21 stores a larger number of electrons than before, and the threshold voltage of the memory transistor Q7 with reference to the control gate 30 becomes higher than that before program operation. The state is referred to as a program state, where logic "0" is stored.

In the above described conventional nonvolatile semiconductor memory device, a single transistor can constitute a memory cell, the chip area can be reduced. However, since programming of the memory cell is performed by injection of hot electrons, a high-voltage generator circuit using an on-chip charge pump and the like does not provide sufficient current driving ability, so that the programming high-voltage must be externally applied. Therefore, the semiconductor memory device can not be operated by a single power supply of 5 V. In addition, since programming is performed by injection of hot electrons, the characteristics of the insulating film formed between the floating gate and the drain region are liable to deteriorate, and the number of times of repeating erasing/programming is as small as about $10^3$ times. This deterioration occurs for the following reason. The energy of hot electrons injected into the oxide (insulating film) is higher than that of electrons injected through tunneling. While the energy of a hot electron is higher than the barrier height of Si-SiO$_2$ (the semiconductor substrate—the insulating film) interface, a tunneled electron's energy is lower than the barrier height. Therefore, the damage to the oxide (insulating film) by hot electron is much larger than that by tunneled electron.

Figure 3:
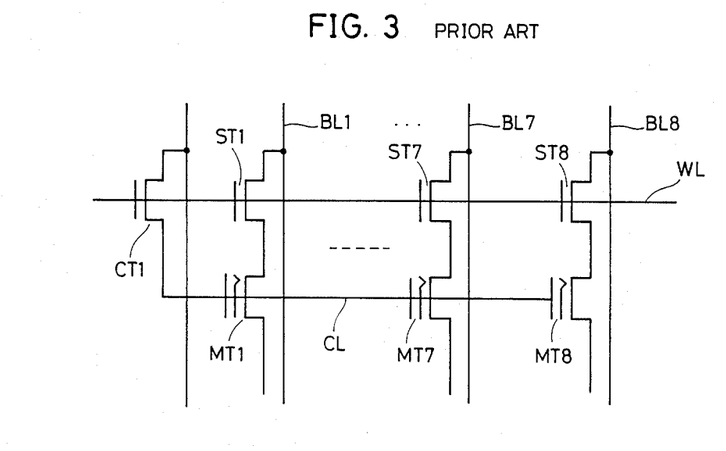
FIG. 3 is a diagram schematically showing a one-byte structure in a memory device in which two transistors in a memory portion of a conventional EEPROM constitute a single memory cell.

In a structure of the conventional EEPROM in which, two transistors constitute a single memory cell, and since, in order to reduce the chip area in these devices, a control transistor CT is provided for one-byte memory cells as shown in FIG. 3 so that erasing is simultaneously performed on every one-byte memory cell, the erase cycle is necessarily required in the data write cycle.

More specifically, in the structure of the EEPROM shown in FIG. 3, the identical voltage is simultaneously applied to control gates of memory transistors MT1 to MT8 through the control transistor CT. Therefore, if it is desired to write, for example, information "0" to only a single memory cell, other memory cells can not be erased simultaneously, so that it is necessary to erase information of the one-byte memory cells so that information "1" can be stored and then, to write information "0". As a result, the erase cycle is necessarily required in the data write cycle, so that the data write cycle becomes longer.

As the prior art, a nonvolatile semiconductor memory device in which erasing is performed by a tunnel current and programming is performed by avalanche injection of electrons is disclosed in, "A 128K/EEPROM using Double Polysilicon Technology", ISSCC' 87, Digest of Technical Papers, p. 76, "A 1.5 V Single-Supply One-Transistor CMOS EEPROM", IEEE, Journal of Solid-State Circuits, Vol. SC-16, 1981, pp. 195–199, "An 8192-Bit Electrically Alterable ROM Employing a One-Transistor with Floating Gate" IEEE, Journal of Solid-State Circuits, Vol. SC-12, No. 5, 1977, pp. 507–514, "A Single Transistor Electrically Alterable Cell," IEEE Electron Device Letters, Vol. EDL-6, No. 10, October 1985, pp. 519–521, "A Source-Side Injection Erasable Programmable Read-Only-Memory (SI-EPROM) Device," IEEE Electron Device Letter, Vol. EDL-7, No. 9, September 1986, pp. 540–542, "A true Single-Transistor Oxide-Nitride-Oxide EEPROM Device," IEEE Electron Device Letters Vol. EDL-8, No. 3, March 1987, pp. 93–95, and "Electrically Erasable and Reprogrammable Read-Only-Memory Using n-channel SIMOS One-Transistor Cell," IEEE TRANSACTIONS ON Electron Devices, Vol. ED-24, No. 5, May 1977, pp. 606–610. According to the prior art, a single transistor constitutes a single memory cell but an erase cycle is included in a data write cycle, so that erasing can not be performed on a bit by a bit.

SUMMARY OF THE INVENTION

An object of the present invention is to solve the above described problems of a conventional nonvolatile semiconductor memory device and to provide a nonvolatile semiconductor memory device capable of operating by a single power supply of 5 V.

Another object of the invention is to increase the number of times of erasing/programming may be repeated.

Further object of the invention is to provide an EEPROM requiring no erase cycle.

A nonvolatile semiconductor memory device according to the present invention comprises means for precharging a word line and a bit line to a voltage less than a write high-voltage $V_{pp}$ at the time of a data write cycle, means responsive to data to be written for providing the write high-voltage or a ground potential to the selected word line, means responsive to data to be written for providing the write high-voltage or the ground potential to the selected bit line, and means for holding a non-selected word line and a non-selected bit line at a precharged potential.

In the above described structure, since a precharge voltage is at a write inhibiting voltage level at which current never flows between a floating gate and a drain of a memory transistor, a write high-voltage having a polarity corresponding to write data is applied only between the control gate and the drain of the memory transistor located in an intersection of the selected word line and the selected bit line, whereby information "1" and "0" are written through a tunnel phenomenon of electrons between the floating gate and the drain. On the other hand, since a precharge voltage of a write inhibiting voltage is applied to the non-selected word lines and the non-selected bit lines, only the selected memory transistor can be accessed in writing and erasing of information. In addition, since both writing and erasing are performed using a tunnel current without producing hot electrons, the high-voltage externally applied is not required.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 6A to 6C are diagrams showing a structure of a transistor constituting a memory cell used in the nonvolatile semiconductor memory device according to the present invention, where

FIGS. 7A and 7B are diagrams showing a structure of a tri-level $V_{pp}$ switching circuit used in an embodiment of the present invention, where

DESCRIPTION OF THE PREFERRED EMBODIMENTS

Referring now to FIGS. 4 to 9, description is made on an embodiment of the present invention.

Figure 4:
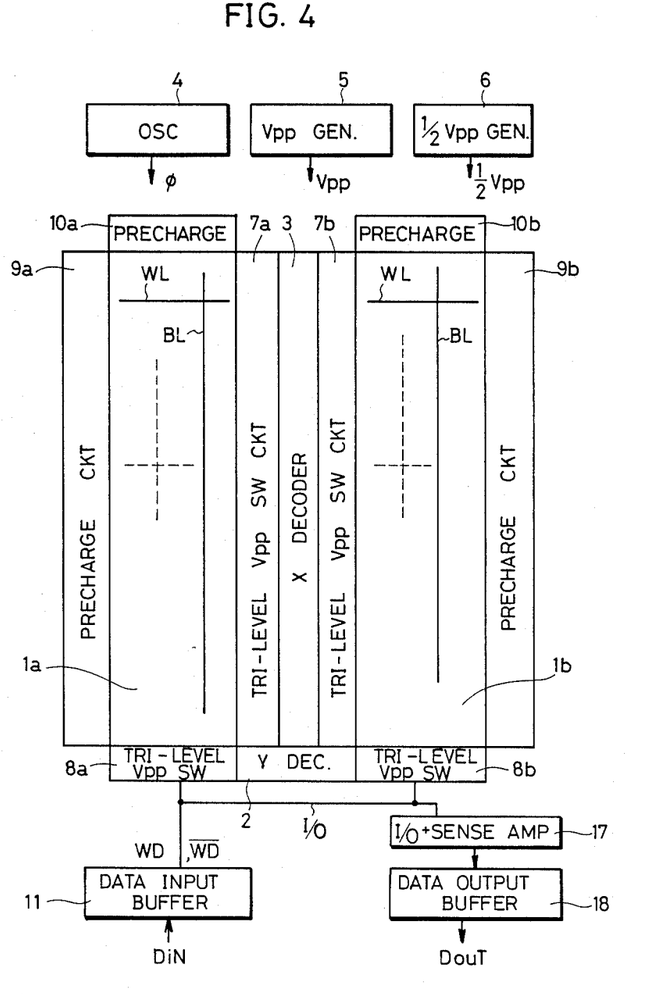
FIG. 4 is a diagram showing a schematic structure of a nonvolatile semiconductor memory device according to an embodiment of the present invention.

FIG. 4 is a diagram showing a schematic of the entire structure of a nonvolatile semiconductor memory device according to an embodiment of the present invention. In FIG. 4, a memory cell array is divided into two blocks 1a and 1b, each comprising a plurality of word lines WL and bit lines BL, and a plurality of memory cells. Each memory cell is disposed at an intersection of the word line WL and the bit line BL. An X decoder 3 for selecting a single word line designated by an external address and a Y decoder 2 responsive to the external address for selecting a single bit line are provided for memory array blocks 1a and 1b. There are provided in association with the memory array block 1a a precharge circuit 9a for transmitting to a word line a write inhibiting voltage, that is, a voltage of $\frac{1}{2}V_{pp}$ applied from a $\frac{1}{2}V_{pp}$ generator circuit 6 at the time of a write cycle, a precharge circuit 10a for precharging a bit line to the voltage of $\frac{1}{2}V_{pp}$ from the $\frac{1}{2}V_{pp}$ generator circuit 6 in the data write cycle, a tri-level $V_{pp}$ switch 8a responsive to data WD to be written applied through a data input buffer 11 and an output of the Y decoder 2, for setting a potential on a bit line to one among a write high-voltage $V_{pp}$, a ground potential and the voltage of $\frac{1}{2}V_{pp}$ after precharge in the data write cycle, and a tri-level $V_{pp}$ switching circuit 7a responsive to an output of the X decoder 3 and data WD to be written applied from the data input buffer 11, for setting a potential on a word line to one among the write high-voltage $V_{pp}$ (15~20 V), the write inhibiting voltage (precharge voltage) $\frac{1}{2}V_{pp}$ and the ground potential (0 V) after precharge cycle.

In the same manner, there are provided in association with the memory array block 1b a precharge circuit 9b for precharging the word line to the voltage $\frac{1}{2}V_{pp}$ at the time of the data write cycle, a precharge circuit 10b for precharging the potential on the bit line to the voltage $\frac{1}{2}V_{pp}$, a tri-level $V_{pp}$ switching circuit 7b, responsive to the output of the X decoder 3 and the data WD to be written, for setting the potential on the word line to one among the write high-voltage $V_{pp}$, the precharge voltage $\frac{1}{2}V_{pp}$ and the ground potential 0 V, and a tri-level $V_{pp}$ switching circuit 8b, responsive to the output of the Y decoder 2 and the data $\overline{WD}$ to be written, for setting the potential on the bit line to one among the write high-voltage $V_{pp}$, the precharge voltage $\frac{1}{2}V_{pp}$ and the ground potential 0 V. The tri-level $V_{pp}$ switches 8a and 8b are connected to a data output buffer 18 through an I/O+ sense amplifier circuit group 17.

Furthermore, in order to control operation of the nonvolatile semiconductor memory device, there are provided an oscillator 4 for generating a clock signal having a predetermined frequency (5~10 MHz), a $V_{pp}$ generator circuit 5 for generating the write high-voltage $V_{pp}$, and the $\frac{1}{2}V_{pp}$ generator circuit 6 for generating the precharge voltage $\frac{1}{2}V_{pp}$. The $V_{pp}$ generator circuit 5, which is formed using, for example, a charge pump, boosts the power-supply voltage 5 V and generates the write high-voltage $V_{pp}$ in response to a clock signal $\phi$. The clock signal $\phi$ applied from the oscillator 4 is also applied to the tri-level $V_{pp}$ switching circuits 7a, 7b, 8a and 8b.

Figure 5:
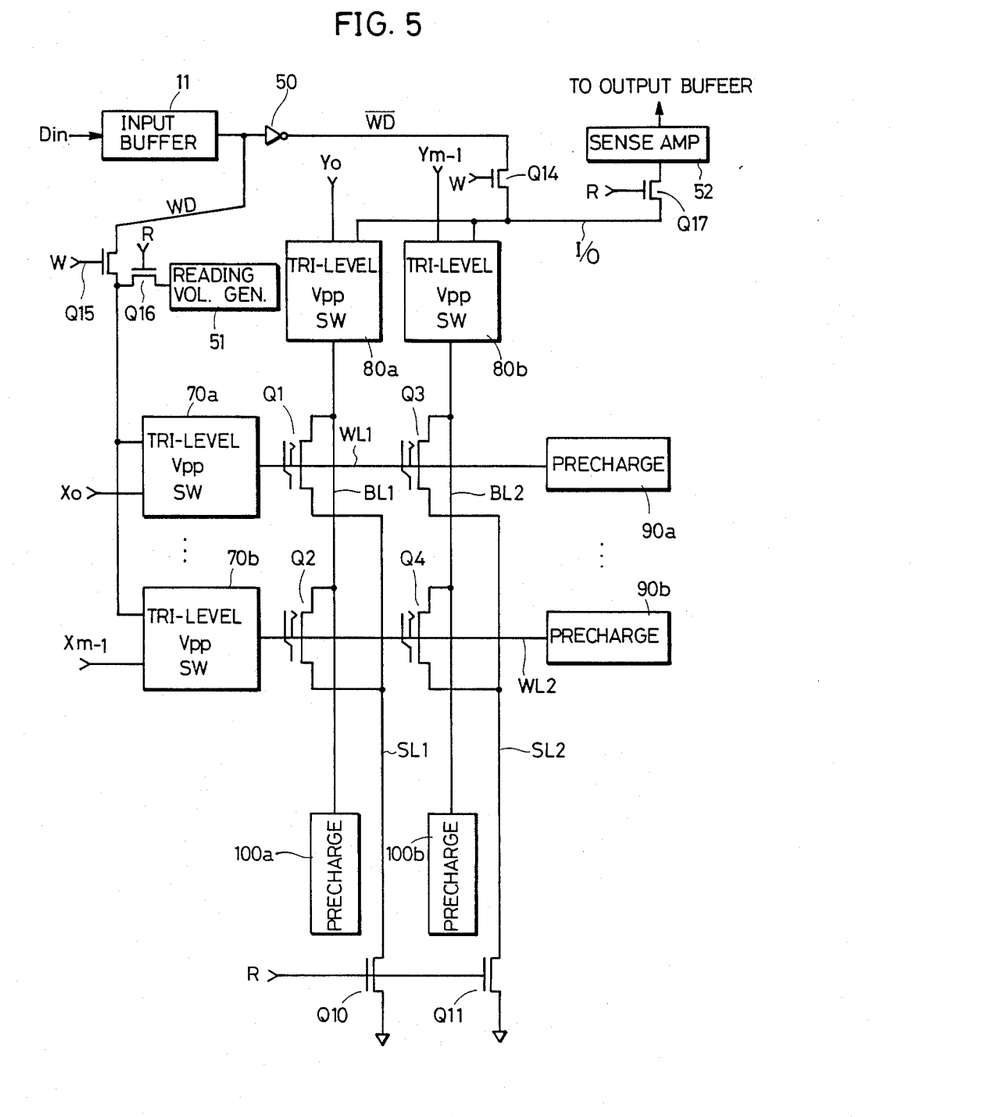
FIG. 5 is a diagram showing a schematic structure of a main portion of the nonvolatile semiconductor memory device according to an embodiment of the present invention.

FIG. 5 is a diagram showing schematically a structure of a memory array portion of the nonvolatile semiconductor memory device according to an embodiment of the present invention. In FIG. 5, four memory transistors Q1 to Q4 are illustrated. Each of the memory transistors Q1 to Q4 is a memory transistor of a floating gate type having a tunnel insulating film region. A single memory cell comprises only a single transistor, which is referred to as a single transistor type memory cell. Each of the memory transistors Q1 and Q3 has a control gate connected to a word line WL1, and each of the memory transistors Q2 and Q4 has a control gate connected to a word line WL2. Each of the memory transistors Q1 and Q2 has a drain connected to a bit line BL1, and each of the memory transistors Q3 and Q4 has a drain connected to a bit line BL2. In addition, each of the memory transistors Q1 and Q2 has a source connected to a source line SL1, and each of the memory transistors Q3 and Q4 has a source connected to a source line SL2. The other ends of the source lines SL1 and SL2 are connected to switching transistors Q10 and Q11, respectively, which are responsive to a read signal R to be turned on for connecting source terminals SL1 and SL2 to the ground potential. The word lines WL1 and WL2 and the bit lines BL1 and BL2 are connected to precharge circuits 90a, 90b, 100a, 100b, respectively, for precharging the word lines and the bit lines to the precharge voltage $\frac{1}{2}V_{pp}$ at the time of the data write cycle. The word line WL1 is connected to a tri-level $V_{pp}$ switch 70a which is responsive to data WD to be written applied through the input buffer 11 and an output Xo of an X decoder for setting a potential on the word line WL1 to one among the write high-voltage, the ground potential and the precharge voltage. The word line WL2 is connected to a tri-level $V_{pp}$ switch 70b which is responsive to the data WD to be written and an output Xm-1 from the X decoder for setting the potential on the word line WL2 to one among the write high-voltage $V_{pp}$, the precharge voltage and the ground potential. The bit line BL1 is connected to a tri-level $V_{pp}$ switch 80a which is responsive to an inverted signal $\overline{WD}$ of data to be written from the input buffer 11 through an inverter 50 and an output Yo from a Y decoder for setting a potential on the bit line BL1 to one among the write high-voltage $V_{pp}$, the precharge voltage $\frac{1}{2}V_{pp}$ and the ground potential. The bit line BL2 is connected to a tri-level $V_{pp}$ switch 80b which is responsive to the inverted signal $\overline{WD}$ of the data to be written applied through the inverter 50 and an output Ym-1 of a Y decoder for setting the potential on the bit line BL2 to one among the write high-voltage $V_{pp}$, the precharge voltage $\frac{1}{2}V_{pp}$ and the ground potential. The tri-level $V_{pp}$ switches 80a and 80b have input/output portions connected to an I/O line. A switching transistor Q14 which is responsive to a write designating signal W to be turned on is connected between the I/O line and the inverter 50. In addition, a switching transistor Q17 which is responsive to a read designating signal R to be turned on is connected between the I/O line and a sense amplifier 52.

A transistor switch Q15 which is responsive to the write designating signal W to be turned on is connected between the data input buffer 11 and one input of each of the tri-level $V_{pp}$ switches 70a and 70b. Furthermore, a transistor switch 16 which is responsive to the read designating signal R to be turned on for transmitting an output of a read voltage generator circuit 51 is connected to one input of each of the tri-level $V_{pp}$ switches 70a and 70b.

Figure 6A:
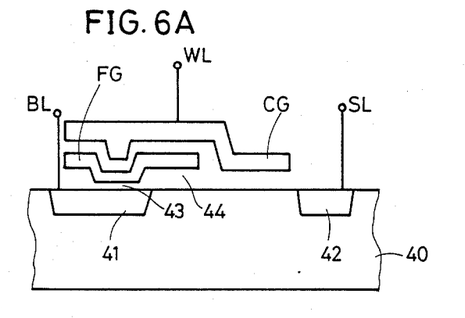
FIG. 6A is a cross-sectional view showing a structure thereof.
Figure 6B:
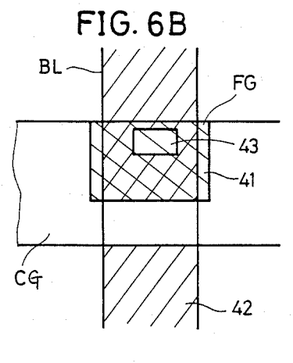
FIG. 6B is a plan view showing a structure thereof and FIG. 6C is a diagram showing an equivalent circuit thereof.
Figure 6C:
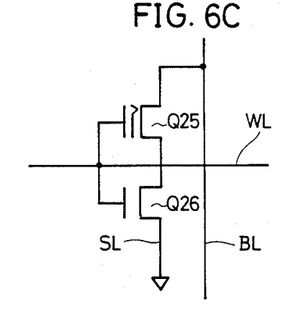

FIGS. 6A to 6C are diagrams showing a structure of a memory device and an equivalent circuit used in an embodiment of the present invention, where FIG. 6A is a cross-sectional view showing a structure thereof, FIG. 6B is a plan view showing a structure thereof and FIG. 6C is a diagram showing an equivalent circuit thereof.

As shown in FIGS. 6A and 6B, the memory device comprises a drain region 41 and a source region 42 formed by implanting and diffusing impurities in a predetermined region on the surface of a semiconductor substrate 40 such as silicon, a floating gate FG formed to have a tunnel insulating film region 43 in a part of a region overlapped with the drain region 41, and a control gate CG formed on the floating gate FG to extend to the source region 42. A region where the floating gate FG does not exist is provided between the control gate CG and the semiconductor substrate 40, and the region functions as a conventional MOS transistor. The tunnel insulating film region 43 has a thickness of about 100 Å, and an insulating film 44 formed between the floating gate in a region other than the tunnel insulating film 43 and the surface of the semiconductor substrate 40 has a thickness of about 350 to 500 Å. The drain region 41 is connected to the bit line BL, the control gate CG is connected to the word line WL and the source region 42 is connected to the source line SL. In this structure, since a single transistor can constitute a single memory cell, the equivalent circuit is adapted such that a transistor Q25 of a floating gate type having a tunnel insulating film and a switching transistor Q26 are connected in series, and the transistors Q25 and Q26 have gates connected to the word line WL, as shown in FIG. 6C.

Figure 7A:
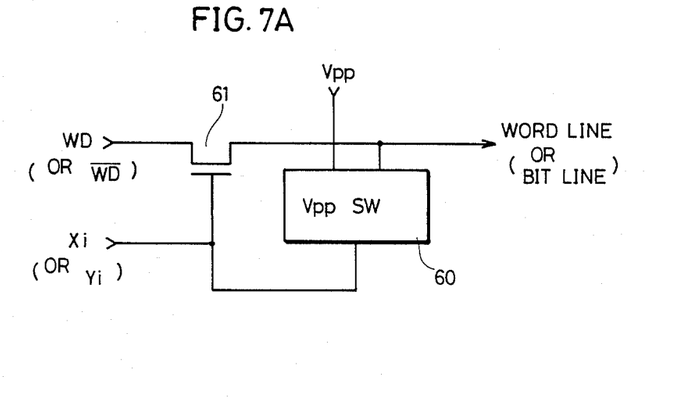
FIG. 7A is a diagram showing a functional block thereof and FIG. 7B is a diagram showing an example of a specific structure thereof.
Figure 7B:
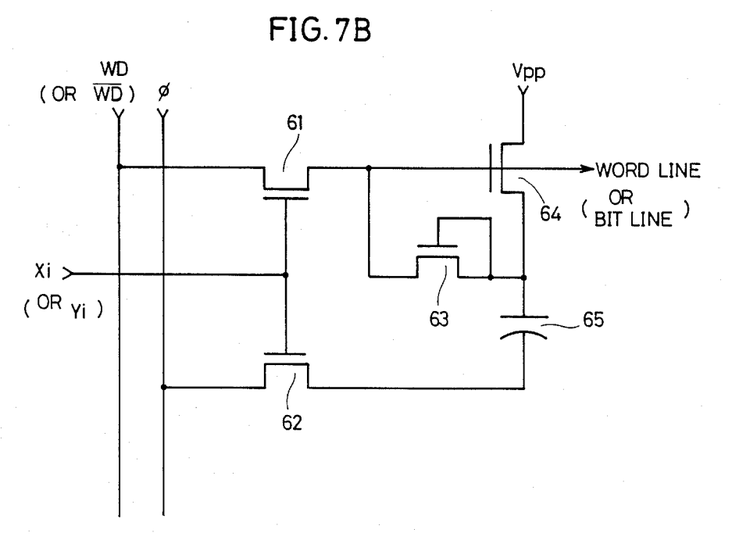

FIGS. 7A and 7B are diagrams showing a further detailed structure of a tri-level $V_{pp}$ switching circuit used in an embodiment of the present invention. As shown in FIG. 7A, the tri-level $V_{pp}$ switch, in a functional block manner, comprises a switching transistor 61, which is responsive to an output Xi (or Yi) of a decoder to be turned on/off, for transmitting data WD (or $\overline{WD}$) to be written, and a $V_{pp}$ switch 60, which is responsive to the output Xi (or Yi) of the decoder and a signal applied through the switching transistor 61 to be operated, for receiving a write high-voltage $V_{pp}$ and applying the write high-voltage $V_{pp}$ to the word line (or the bit line). More specifically, as shown in FIG. 7B, the $V_{pp}$ switch 60 comprises an MOS transistor 61, which is responsive to the output Xi (or Yi) of the decoder to be turned on/off, for transmitting the data WD (or $\overline{WD}$) to be written, an MOS transistor 62, which is responsive to the output Xi (or Yi) of the decoder to be turned on/off, for transmitting the clock signal $\phi$, an MOS transistor 64 having a gate receiving an output of the MOS transistor 61 and one conduction terminal receiving write high-voltage $V_{pp}$, an MOS transistor 63 having a diode-connection between the other conduction terminal of the MOS transistor and the gate, and an MOS capacitor 65 connected between the other conduction terminal of the MOS transistor 64 and an output terminal of the MOS transistor 62. The MOS transistor 64 has a gate connected to the word line (or the bit line). In the structure of the tri-level $V_{pp}$ switch, the word line (or the bit line) is set to either the write high-voltage $V_{pp}$ the ground potential or a floating state.

Figure 8:
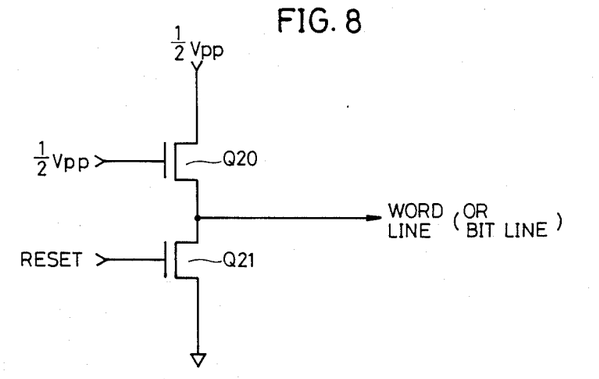
FIG. 8 is a diagram showing an example of a specific structure of a precharge circuit used in an embodiment of the present invention.

FIG. 8 is a diagram showing an example of a specific structure of a precharge circuit shown in FIG. 5. As shown in FIG. 8, the precharge circuit comprises an MOS transistor Q20 having a gate receiving a $\frac{1}{2}V_{pp}$ voltage signal from the generator $\frac{1}{2}V_{pp}$ circuit 6 and other conduction terminal receiving the $\frac{1}{2}V_{pp}$ signal, and an MOS transistor Q21 having a gate receiving a reset signal and other conduction terminal connected to the ground potential. A common node of the MOS transistors Q20 and Q21 is connected to the word line (or bit line).

Figure 9:
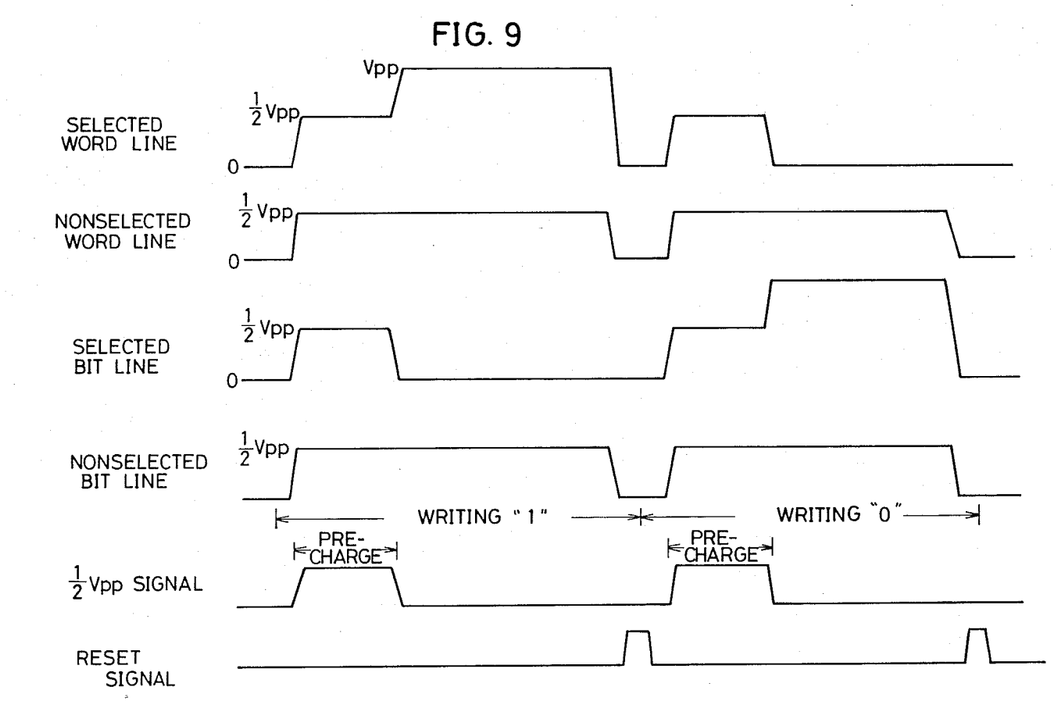
FIG. 9 a waveform diagram showing operation at the time of writing data in the nonvolatile semiconductor memory device according to an embodiment of the present invention.

FIG. 9 is a waveform diagram showing operation at the time of data writing of the nonvolatile semiconductor memory device according to an embodiment of the present invention. Referring now to FIGS. 1 to 6, description is made on operation of the nonvolatile semiconductor memory device according to an embodiment of the present invention. At the time of the data write cycle, the write designation signal W attains an "H" level and the read designating signal R attains an "L" level. As a result, the tri-level $V_{pp}$ switches 70a and 70b are connected to the input buffer 11 through the switching transistor Q15, and the tri-level $V_{pp}$ switches 80a and 80b are connected to the input buffer 11 through the switching transistor Q14 and the inverter 50. At the time of the write cycle, the data WD to be written to the input buffer 11 is provided, so that the data WD to be written is transmitted to the tri-level $V_{pp}$ switches 70a and 70b for the word line and the inversion signal $\overline{WD}$ of the data WD to be written is transmitted to the tri-level $V_{pp}$ switches 80a and 80b for the bit line.

Description is now made on operation for writing information "1". At that time, data to be written is at the "H" level, so that the "L" level signal is transmitted to the I/O line. At the time of precharge in the data write cycle, the X decoder 3 and the Y decoder 2 are not activated, so that all outputs are at the "L" level. At that time, the precharge voltage (the write inhibiting voltage) $\frac{1}{2}V_{pp}$ is generated from the $\frac{1}{2}V_{pp}$ generator circuit 6 and applied to the precharge circuits 90a, 90b, 100a and 100b. Therefore, the precharge voltage $\frac{1}{2}V_{pp}$ is transmitted to the word lines WL1 and WL2 and the bit lines BL1 and BL2 through the transistor Q20 in the precharge circuit, so that each of the word lines and each of the bit lines are precharged to the $\frac{1}{2}V_{pp}$ voltage, respectively. The X decoder 3 and the Y decoder 2 operate, so that a single word line and a single bit line are selected in response to the external address. The tri-level $V_{pp}$ switches 70a and 70b are activated, and they generate the write high-voltage $V_{pp}$ and transmit the same to the word line when a received output Xi of the decoder 3 is at the "H" level while they make the word line electrically floating when a received output Xi of the decoder is at the "L" level. Therefore, the selected word line attains the write high-voltage $V_{pp}$ level, and the non-selected word line remains at the precharge voltage $\frac{1}{2}V_{pp}$ level. Referring now to FIG. 7, the tri-level $V_{pp}$ switch will be subsequently described in more detail. On the other hand, the tri-level $V_{pp}$ switches 80a and 80b corresponding to the bit lines make the potential on the bit line the "L" (ground potential) level when the output Yi of the Y decoder 2 is at the "H" level while they make a bit line electrically floating when the output Yi of the Y decoder is at the "L" level. Therefore, the potential on the selected bit line is forced to the "L" level, and the non-selected bit line is forced to the $\frac{1}{2}V_{pp}$ voltage. As a result, since the write high-voltage $V_{pp}$ is transmitted to the word line of the selected memory cell designated by the address signal and 0 V which is the "L" (ground potential) level is applied to the bit line thereof, the write high-voltage $V_{pp}$ is applied to a control gate (CG in FIG. 6A) of a transistor of the selected memory cell and 0 V is applied to the drain region 41 (FIG. 6A) of the transistor. Therefore, electrons are injected to the floating gate FG through the tunnel oxide film (insulating film) 43 in the form of the tunnel current, so that the threshold voltage of the memory cell with reference to the control gate CG is shifted to a higher level. On the other hand, in the non-selected memory cell, since the potential difference between the control gate CG and the drain 41 is 0 V or $\frac{1}{2}V_{pp}$, the tunnel phenomenon of electrons never occurs, so that the amount of charges stored in the floating gate FG does not change. More specifically, a previously stored state is kept. As a result, information "1" can be written into only the selected memory cell.

Description is made on operation for writing information "0". At that time, the data WD to be written is at the "L" level, so that the "H" level is applied to the I/O line. After precharge of the word lines WL1 and WL2 and the bit lines BL1 and BL2, the X decoder 3 and the Y decoder 2 are activated and the outputs of the decoders are established, so that the potential on the selected word line attains the "L" level of the ground potential by the tri-level $V_{pp}$ switches 70a and 70b, and the non-selected word line is made electrically floating to keep the precharge voltage $\frac{1}{2}V_{pp}$ state. In the same manner, the write high-voltage $V_{pp}$ is transmitted to the selected bit line by the tri-level $V_{pp}$ switches 80a and 80b and the non-selected bit line is made electrically floating to keep the precharge voltage $\frac{1}{2}V_{pp}$ state. As a result, since the ground potential 0 V is applied to the control gate CG of the selected memory cell and the write high-voltage $V_{pp}$ is applied to the drain 41 thereof, electrons flow from the floating gate FG through the tunnel oxide film region 43 in the form of the tunnel current. Therefore, the floating gate CG lacks electrons, so that the threshold voltage with reference to the control gate CG of the memory cell is shifted to a lower level. On the other hand, in the non-selected memory cell, since the potential difference between the control gate CG and the drain 41 is 0 V or $\frac{1}{2}V_{pp}$, the tunnel phenomenon of electrons does not occur, so that the amount of charges stored in the floating gate FG does not change and the non-selected memory cell is kept in the previous state. In the above described manner, access to only a single memory cell becomes possible for writing data, and the erase cycle is not required in the data write cycle, so that the data write cycle can be substantially reduced in the time as compared with the conventional device.

Referring now to FIG. 7B, description is made of detailed operation of the tri-level $V_{pp}$ switch. In the circuit structure, the tri-level $V_{pp}$ switching circuit for a word line and the $V_{pp}$ switching circuit for a bit line have the identical structure. The MOS transistor 61 has one terminal receiving data to be written or the inverted signal thereof, so that a voltage applied to the selected word line and the selected bit line can be changed. During the precharging time period, the output Xi (or Yi) of the decoder is at the "L" level. Therefore, both the MOS transistors 61 and 62 are off, so that the tri-level $V_{pp}$ switch is not activated. When the X (or Y) decoder is activated and the output of the decoder is stabilized, the output Xi (or Yi) of the decoder connected to the selected word line attains "H" level and the MOS transistors 61 and 62 are turned on. If and when the data WD is at the "H" level, the MOS transistor 64 is turned on, so that the write high-voltage $V_{pp}$ is transmitted to the word (or bit) line. An MOS capacitor 65 receives at its one electrode a voltage depending on a gate potential of the MOS transistor 64. Since the MOS capacitor 65 has the other electrode receiving the clock signal $\phi$ through the MOS transistor 62, a voltage applied to one electrode of the MOS capacitor 65 is sequentially boosted in response to the clock signal and the boosted voltage is fed back to the gate of the MOS transistor 64 through the MOS transistor 63. When the process is repeated, the gate potential of the MOS transistor 64 is boosted to the write high-voltage $V_{pp}$. Accordingly, the potential on the word line (or bit line) is boosted to the write high-voltage $V_{pp}$.

Furthermore, if and when the output of the decoder is at the "H" level and the signal WD is at the "L" level, that is, information "0" is written, the potential at the "L" level is transmitted through the MOS transistor 61, so that the MOS transistor 64 remains in the off state. Therefore, even if the clock signal $\phi$ is transmitted to the other electrode of the MOS capacitor 65, a boosting function of the MOS capacitor 65 does not occur, so that the gate potential of the MOS transistor 64 remains at the "L" level. Accordingly, the potential on the word line (or bit line) is decreased to the "L" level through the MOS transistor 61.

On the other hand, in the case of the non-selected state, the output Xi (or Yi) of the decoder is at the "L" level and the MOS transistors 61 and 62 are turned off. Therefore, the word line (or the bit line) is rendered to be electrically floating, so that the previous precharged state is kept.

At the time of data read operation, the data read designating signal R attains the "H" level and the write designating signal W attains the "L" level. Therefore, a read voltage from the read voltage generator circuit 51 shown in FIG. 5 is transmitted to a data transmission line of the tri-level $V_{pp}$ switches 70a and 70b. At the time of data read operation, since the write high-voltage $V_{pp}$, the precharge voltage $\frac{1}{2}V_{pp}$ and the clock signal $\phi$ are not generally generated, the tri-level $V_{pp}$ switch never performs the boosting function if a read voltage which is near or less than the normal power-supply voltage $V_{cc}$ level is transmitted from the read voltage generator circuit 51, so that the signal supplied from the read voltage generator circuit 51 is transmitted to the selected word line.

As described in the foregoing, according to the present invention, since at the time of a data write cycle, potentials on a word line and a bit line are precharged to a precharge voltage which is a write inhibiting voltage and then potentials on a selected word line and a selected bit line are set to one among a write high-voltage, a precharge voltage and a ground potential in response to data to be written, the remaining non-selected word lines and bit lines are rendered to be electrically floating so that a precharge voltage state is kept, and erasing (writing of information "1") and programming (writing of information "0") of data are performed utilizing a tunnel current through a tunnel insulating film of a transistor of a memory cell, the write high-voltage is produced using an internal booster circuit and memory operation with a single 5 V-supply can be performed. In addition, since writing (erasing) is performed using a tunnel phenomenon, deterioration of the insulating film can be reduced as compared with writing using hot electrons, the number of times of repeating erasing/programming can be increased and erasing/programming can be performed with respect to a single memory cell, an erase cycle can be avoided at the time of data writing, so that data write cycle time can be remarkably reduced.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. In a nonvolatile semiconductor memory device having a plurality of word lines, a plurality of bit lines intersecting with said word lines, a plurality of memory cells, each said cell being a single transistor type cell provided in each intersection of said plurality of word lines and said plurality of bit lines for storing information in a nonvolatile manner:

means for generating a write high-voltage for writing data into said cells;

means for generating a precharge potential greater than a ground voltage and less than said write high-voltage;

addressing means for selecting a word line and a bit line intersecting a selected cell;

first means responsive to data to be written for providing selectively the write high-voltage or the ground voltage to the word line selected by said addressing means;

second means responsive to said data to be written for providing selectively the write high-voltage or the ground voltage to the bit line selected by said addressing means; and means for maintaining a non-selected word line and a non-selected bit line at said precharge potential.

2. A nonvolatile semiconductor memory device in accordance with claim 1, wherein
said first means applies said write high-voltage to a word line selected by said addressing means when said data to be written is of the one state, and applies the ground potential to the word line selected by said addressing means when said data to be written is of the other state.

3. A nonvolatile semiconductor memory device in accordance with claim 1, wherein
said second means applies the ground potential to the bit line selected by said addressing means when said data to be written is of the one state, and applies said write high-voltage to the bit line selected by said addressing means when said data to be written is of the other state.

4. A nonvolatile semiconductor memory device in accordance with claim 1, wherein
said first and second means have the identical circuit structure, said data to be written is applied to said first means, and an inverted signal of said data to be written is applied to said second means.

5. A nonvolatile semiconductor memory device in accordance with claim 1, wherein
said first means comprises a plurality of first circuit means each provided on each of said plurality of word lines, said first circuit means comprising
a first switching transistor responsive to an output of said addressing means to be turned on/off for transmitting said data to be written,
a second switching transistor responsive to the output of said addressing means to be turned on/off for transmitting a clock signal, and
means responsive to outputs of said first switching transistor and said second switching transistor to be activated for generating said write high-voltage when said data to be written is of the one state and generating said ground potential when said data to be written is of the other state,
both an output of said voltage generating means and the output of said first switching transistor being connected to a corresponding word line.

6. A nonvolatile semiconductor memory device in accordance with claim 5, wherein
said voltage generating means comprises
a first MOS transistor having a gate receiving the output of said first switching transistor, one conduction terminal receiving said write high-voltage and the other conduction terminal,
a second MOS transistor having a diode-connection connected between the other conduction terminal of said first MOS transistor and the gate of said first MOS transistor, and
an MOS capacitor connected between the other conduction terminal of said first MOS transistor and said second switching transistor,
both the output of said first switching transistor and the gate of said first MOS transistor being connected to corresponding word lines.

7. A nonvolatile semiconductor memory device in accordance with claim 1, wherein
said second means comprises a plurality of second circuit means each provided corresponding to each of said plurality of bit lines, said second circuit means comprising
a third switching transistor responsive to an output of said addressing means to be turned on/off for transmitting an inversion signal of said data to be written,
a fourth switching transistor responsive to the output of said addressing means to be turned on/off for transmitting said clock signal, and
means responsive to outputs of said third switching transistor and said fourth switching transistor to be activated for generating said ground potential when said data to be written is of the one state and generating said write high-voltage when said data to be written is of the other state,
both an output of said voltage generating means and the output of said third switching transistor being connected to a corresponding bit line.

8. A nonvolatile semiconductor memory device in accordance with claim 7, wherein
said voltage generating means comprises
a third MOS transistor having a gate receiving the output of said third switching transistor, one conduction terminal receiving said write high-voltage and other conduction terminal,
a fourth MOS transistor having a diode-connection provided between the other conduction terminal of said third MOS transistor and the gate of said third MOS transistor,
and a second MOS capacitor provided between the other conduction terminal of said third MOS transistor and said fourth switching transistor, the output of said third switching transistor and the gate of said third MOS transistor being connected to corresponding bit lines.

9. A nonvolatile semiconductor memory device in accordance with claim 1, wherein said precharge potential is about half of said write high-voltage.

10. A nonvolatile semiconductor memory device in accordance with claim 1, wherein
said first circuit means transmits an output of read voltage generating means responsive to the output of said addressing means for generating a predetermined voltage at the time of the data read cycle.

11. A method of operating a nonvolatile semiconductor memory device having a plurality of word lines, a plurality of bit lines intersecting with said word lines, a plurality of memory cells, each said cell being a single transistor type cell provided in each intersection of said plurality of word lines and said plurality of bit lines for storing information in a nonvolatile manner, comprising the steps of:
generating a write high-voltage for writing data into said cells;
generating a precharge potential greater than a ground voltage and less than said write high-voltage;
selecting a word line and a bit line intersecting a selected cell;
in response to data to be written into said memory, providing selectively the write high-voltage or the ground voltage to the selected word line and further providing selectively the write high-voltage or the ground voltage to the selected bit line; and
maintaining a non-selected word line and a non-selected bit line at said precharge potential.

12. In a nonvolatile semiconductor memory device having a plurality of word lines, a plurality of bit lines intersecting with said word lines, a plurality of memory cells, each said cell being a single transistor type cell provided in each intersection of said plurality of word lines and said plurality of bit lines for storing information in a nonvolatile manner; means for generating a write high-voltage for writing data into said cells; addressing means for selecting a word line and a bit line intersecting a selected cell; means responsive to data to be written for providing selectively the write high-voltage or a ground voltage to the word line selected by said addressing means; means responsive to said data to be written for providing selectively the write high-voltage or the ground voltage to the bit line selected by said addressing means:
precharging means operative during a data write cycle for precharging to a voltage greater than the ground voltage and lower than said write high voltage all the word lines intersecting a bit line to which the selected memory cell is connected and all the bit lines intersecting a word line to which the selected memory cell is connected; and
means responsive to said addressing means and data to be written into said selected memory cell for applying to said selected word line and selected bit line respectively one of said write high-voltage, the ground voltage and said precharge voltage, said selected word and bit lines precharged by said precharging means.

* * * * *